(12) United States Patent  (10) Patent No.: US 7,198,859 B2
Kwong et al.  (45) Date of Patent: Apr. 3, 2007

(54) MATERIALS AND STRUCTURES FOR ENHANCING THE PERFORMANCE OF ORGANIC LIGHT EMITTING DEVICES

(75) Inventors: Raymond Kwong, Plainsboro, NJ (US);
Yeh-Jiun Tung, Princeton, NJ (US);
Bin Ma, Monroeville, PA (US); David B. Knowles, Apollo, PA (US)

(73) Assignee: Universal Display Corporation, Ewing, NJ (US)

( * ) Notice: Subject to any disclaimer, the term of this patent is extended or adjusted under 35 U.S.C. 154(b) by 234 days.

(21) Appl. No.: 10/626,730

(22) Filed: Jul. 25, 2003

(65) Prior Publication Data

US 2005/0019605 A1   Jan. 27, 2005

(51) Int. Cl.
*H01L 51/56* (2006.01)
*H05B 33/12* (2006.01)

(52) U.S. Cl. ............... 428/690; 428/917; 313/504; 313/506; 257/E51.043

(58) Field of Classification Search ............... None
See application file for complete search history.

(56) References Cited

U.S. PATENT DOCUMENTS

| | | | |
|---|---|---|---|
| 4,769,292 A | 9/1988 | Tang et al. | 428/690 |
| 5,247,190 A | 9/1993 | Friend et al. | 257/40 |
| 5,703,436 A | 12/1997 | Forrest et al. | 313/506 |
| 5,707,745 A | 1/1998 | Forrest et al. | 428/432 |
| 5,834,893 A | 11/1998 | Bulovic et al. | 313/506 |
| 5,844,363 A | 12/1998 | Gu et al. | 313/506 |
| 5,925,472 A * | 7/1999 | Hu et al. | 428/690 |
| 6,013,982 A | 1/2000 | Thompson et al. | 313/506 |
| 6,087,196 A | 7/2000 | Sturm et al. | 438/29 |
| 6,091,195 A | 7/2000 | Forrest et al. | 313/504 |
| 6,097,147 A | 8/2000 | Baldo et al. | 313/506 |
| 6,294,398 B1 | 9/2001 | Kim et al. | 438/22 |
| 6,303,238 B1 | 10/2001 | Thompson et al. | 428/690 |
| 6,337,102 B1 | 1/2002 | Forrest et al. | 427/64 |
| 6,392,250 B1 * | 5/2002 | Aziz et al. | 257/40 |
| 6,703,180 B1 * | 3/2004 | Boroson et al. | 430/200 |
| 2003/0020088 A1 * | 1/2003 | Seo et al. | 257/103 |

FOREIGN PATENT DOCUMENTS

JP   9-176629   7/1997
WO   WO 02/15645   2/2002

OTHER PUBLICATIONS

Baldo et al., "Highly Efficient Phosphorescent Emission from Organic Electroluminescent Devices," Nature, vol. 395, 151-154, Sep. 1998.
Baldo et al., "Very High-Efficiency Green Organic Light-Emitting Devices Based on Electrophosphorescence," Appl. Phys. Lett., vol. 5, No. 1, Jul. 4-6, 1999.
Adachi et al., "Nearly 100% Internal Phosphorescent Efficiency In An Organic Light Emitting Device," J. Appl. Phys., 90, 5048-5051, Nov. 2001.
H. Tanaka, et al., "Novel metal-chelate emitting materials based on polycyclic aromatic ligands for electroluminescent devices", J. Mater. Chem., 1998, 8(9), pp. 1999-2003.
D. McCarty, et al., "Blue Emitting Coordination Compounds for Electroluminescent Devices", ACS Meeting, Apr. 1995, Inorganic Session Paper 290.

* cited by examiner

*Primary Examiner*—Marie Yamnitzky
(74) *Attorney, Agent, or Firm*—Kenyon & Kenyon LLP

(57) ABSTRACT

A device is provided, having an anode, a cathode, and a first organic layer disposed between the anode and the cathode. The first organic layer produces phosphorescent emission when a voltage is applied between the anode and the cathode. An organic enhancement layer disposed between the first organic layer and the cathode is also provided. The organic enhancement layer is in direct contact with the first organic layer. The organic enhancement layer may comprise a material of structure (I):

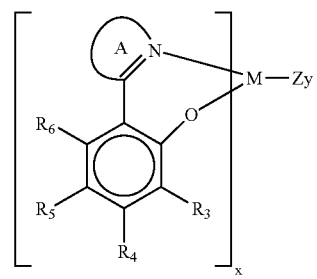

The material of structure I is thermally stable and is a high energy band gap material.

35 Claims, 3 Drawing Sheets

MATERIALS AND STRUCTURES FOR ENHANCING THE PERFORMANCE OF ORGANIC LIGHT EMITTING DEVICES

FIELD OF THE INVENTION

The present invention relates to efficient organic light emitting devices (OLEDs), and more specifically to phosphorescent aromatic organic materials with improved stability and efficiency used in such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

SUMMARY OF THE INVENTION

A device is provided, having an anode, a cathode, and a first organic layer disposed between the anode and the cathode. The first organic layer is capable of being phosphorescent emissive when a voltage is applied between the anode and the cathode. An organic enhancement layer disposed between the first organic layer and the cathode is also provided. The organic enhancement layer may comprise a material having a lowest unoccupied molecular orbital energy level that is greater than that of the hole transporting material in the first organic layer. In preferred embodiments, the organic enhancement layer comprises a material having a lowest unoccupied molecular orbital energy level that is not more than 0.3 eV less, preferably not more than 0.25 eV less and more preferably not more than 0.15 eV less than the energy level of the lowest unoccupied molecular orbital of the hole transporting material in the first organic layer.

The organic enhancement layer is in direct contact with the first organic layer. The organic enhancement layer may comprise a material having the following structure (I):

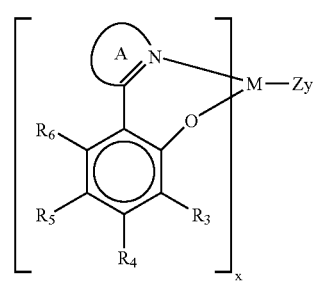

wherein M is a metal;

$R_3$–$R_6$ are substituents, each independently selected from the group consisting of hydrogen, alkyl, alkenyl, alkynyl, alkylaryl, CN, $CF_3$, $C_nF_{2n+1}$, trifluorovinyl, $CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl;

ring A is an aromatic heterocyclic or a fused aromatic heterocyclic ring with at least one nitrogen atom that is coordinated to the metal M, wherein the ring can be optionally substituted;

each Z may be the same or different, and is an ancillary ligand;

x is a value from 1 to the maximum number of ligands that may be attached to the metal; and x+y is less than or equal to the maximum number of ligands that may be attached to the metal. The devices of the invention are thermally stable up to a temperature of at least about 330 C.; have a glass transition temperature of at least about 95 C.; and have a fluorescence peak of about 450 nm or less.

DETAILED DESCRIPTION

Figure 1:
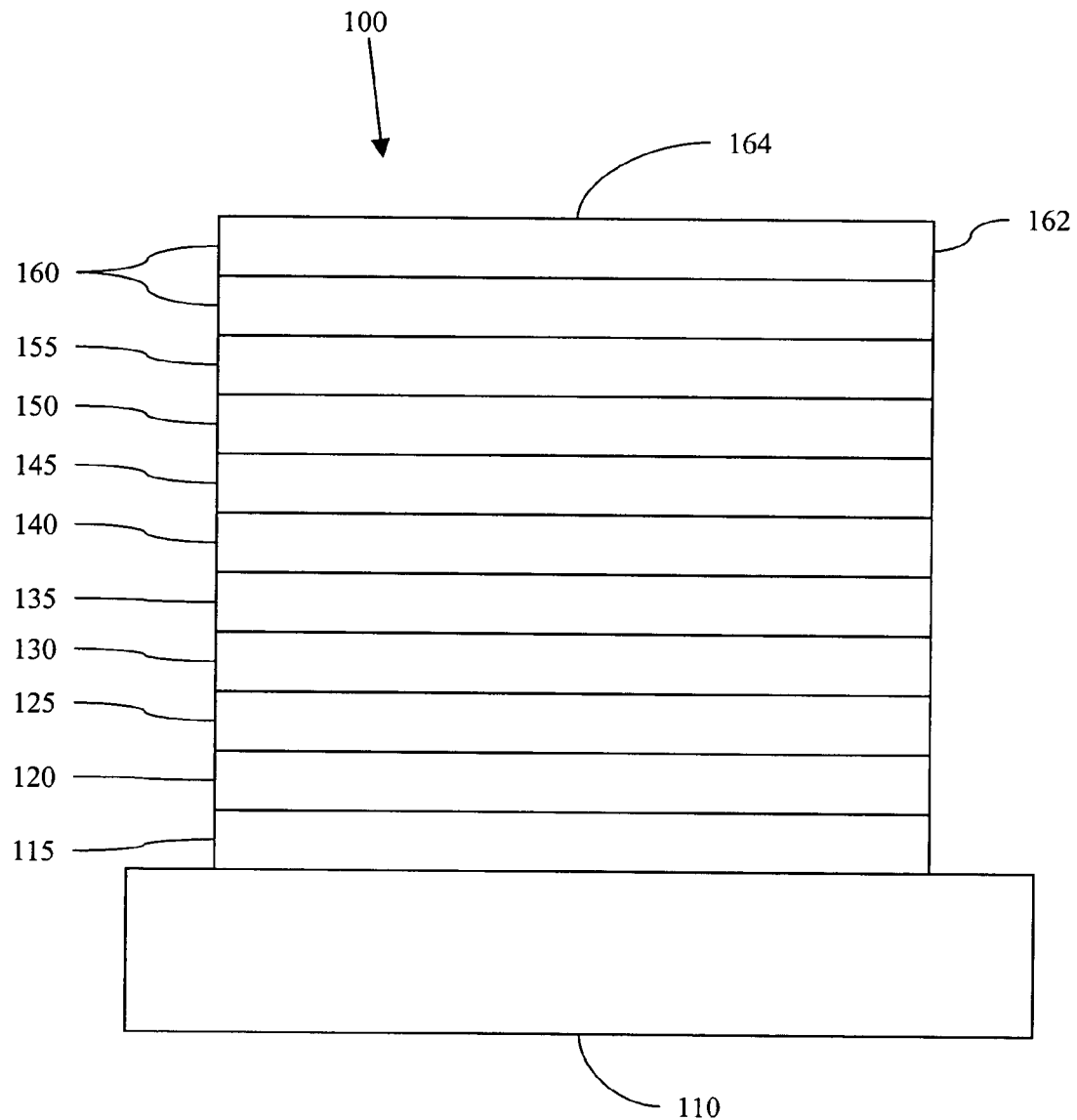
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 1, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003/0230980, which is incorporated by reference in its entirety. Other hole transport layer materials and structures may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 140 may include a material capable of transporting electrons. Electron transport layer 140 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003/0230980, which is incorporated by reference in its entirety. Other electron transport layer materials and structures may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material while the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, to achieve high electron injection efficiency, the work function of the cathode material is preferably not greater than the electron affinity of the charge carrying component of the electron transport layer by more than about 0.75 eV, more preferably, by not more than about 0.5 eV. Most preferably, the electron affinity of the charge carrying component of the electron transport layer is greater than the work function of the cathode material. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer_135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and United States Patent Application Publication No. 2003/0230980, which are incorporated by reference in their entireties. The conventional "blocking layer" is generally believed to reduce the number of charge carriers and/or excitons that leave the emissive layer by presenting an energy barrier that the charge carrier or exciton has difficulty surmounting. For example, hole transport is generally thought to be related to the Highest Occupied Molecular Orbital (HOMO) of a semiconductor. A "hole blocking" material may therefore be thought of as a material that has a HOMO energy level significantly less than that of the material from which the holes are being blocked. A first HOMO energy level is considered "less than" a second HOMO energy level if it is lower on a conventional energy level diagram, which means that the first HOMO energy level would have a value that is more negative than the second HOMO energy level. For example, through the density function theory (DFT) calculation (B3LYP 6-31G*) using the Spartan 02 software package, Ir(ppy)$_3$ has a HOMO energy level of −4.85 eV. BCP has a HOMO energy level of −5.87 eV, which is 1.02 eV less than that of Ir(ppy)$_3$, making it an excellent hole blocker. ZrQ$_4$ has a HOMO energy level of −5.00, only 0.15 eV less than that of Ir(ppy)$_3$, such that little or no hole blocking is expected. mer-GaQ$_3$ has a HOMO energy level of −4.63 eV, which is greater than that of Ir(ppy)$_3$, such that no hole blocking at all is expected. If the emissive layer includes different materials with different energy levels, the effectiveness of these various materials as hole blocking layers may be different, because it is the difference in HOMO energy levels between the blocking layer and the blocked layer that is significant, not the absolute HOMO energy level. But, the absolute HOMO level may be useful in determining whether a compound will be a good hole blocker for particular emissive layers. For example, a material having a HOMO energy level of about −5.15 eV or greater may be considered a reasonable hole blocking material for Ir(ppy)$_3$, which is a desirable emissive material. Generally, a layer having a HOMO energy level that is at least 0.25 less than that of an adjacent layer may be considered as having some hole blocking properties. An energy level difference of at least 0.3 eV is preferred, and an energy level difference of at least 0.7 eV is more preferred. Similarly, the energy of an exciton is generally believed to be related to the band gap of a material. An "exciton blocking" material may generally be thought of as a material having a band gap significantly larger than the material from which excitons are being blocked. For example, a material having a band gap that is about 0.1 eV or more larger than that of an adjacent material may be considered a good exciton blocking material.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. Pat. No. 7,071,615, which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. Pat. No. 7,071,615, which is incorporated by reference in its entirety.

Figure 2:
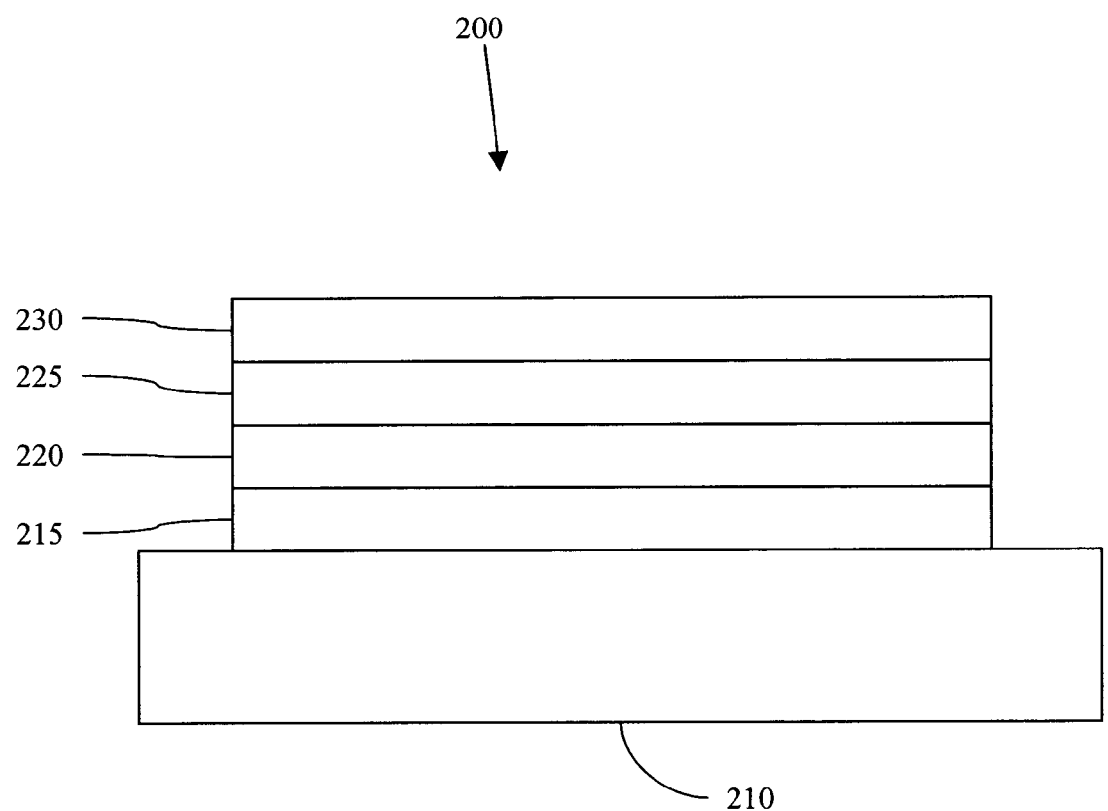
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Of particular interest is the solution processing of the emissive layer for patterning of the color pixels. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20–25° C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

As used herein, "solution processible" means capable of being dissolved, dispersed, or transported in and/or deposited from a liquid medium, either in solution or suspension form.

In an embodiment of the present invention, an organic enhancement layer is provided that is disposed between the cathode and the organic emissive layer closest to the cathode of an organic light emitting device. The organic enhancement layer is in direct contact with the emissive layer. In one embodiment, the organic enhancement layer may also be in direct contact with the cathode.

Figure 3:
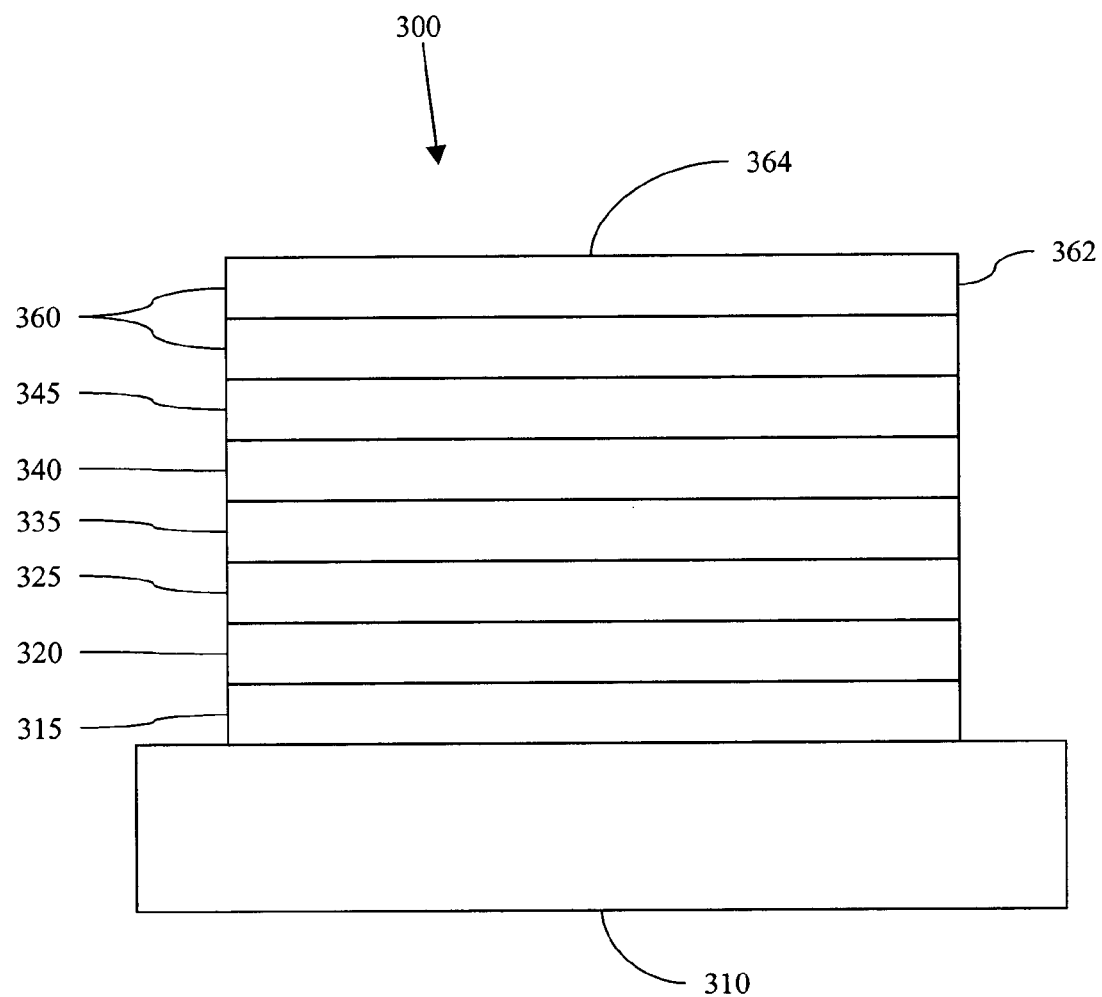
FIG. 3 shows a device having an organic enhancement layer that is not in direct contact with the cathode.

FIG. 3 shows a device 300 having an organic enhancement layer that is not in direct contact with the cathode, because there is a separate electron transport layer. Device 300 includes a substrate 310, an anode 315, a hole injection layer 320, a hole transport layer 325, an organic emissive layer 335, an organic enhancement layer 340, an electron transport layer 345, and a cathode 360. Cathode 360 includes a first conductive layer 362 and a second conductive layer 364. Layers 310, 315, 320, 325, 335, 345 and 360 operate analogously to similarly named substrate 110, anode 115, hole injection layer 120, hole transport layer 125, emissive layer 135, electron transport layer 145, and cathode 160 of FIG. 1. The organic enhancement layer 340, however, may or may not operate as a hole blocking layer analogous to hole blocking layer 140 in FIG. 1.

The organic enhancement layer 340 may improve device performance. The organic enhancement layer 340 is not necessarily a hole blocking layer, and may have a HOMO energy level that is greater than that of emissive layer 335, not more than 0.3 eV less than that of emissive layer 335, or not more than 0.7 eV less than that of emissive layer 335. Where the organic emissive layer includes multiple materials, such as a host and a dopant, the HOMO energy level of the emissive layer is considered to be that of the component that transports holes, which is generally the component having the highest HOMO energy level, provided that the component is present in an appreciable amount, for example about 3% or higher. For example, in a device having an emissive layer comprising CBP doped with $Ir(ppy)_3$, the HOMO level of $Ir(ppy)_3$, which is −4.85 eV, is the HOMO level relevant to charge transport, because it is higher than the HOMO level of CBP, −5.32 eV. Without being bound to any particular theory of how the invention works, it is believed that the organic enhancement layer 340 improves device performance by improving electron injection into emissive layer 335. Factors that may assist in achieving these properties include the use of a material in organic enhancement layer 340 having a low dipole moment, and/or the use of a metallic complex having ligands, where each ligand makes an equivalent contribution to the HOMO and LUMO orbitals of the metal complex due to the symmetry of the metal complex.

In some embodiments, organic enhancement layer 340 may act as a hole blocking layer, which may further enhance device performance, but this is not necessary. In a typical phosphorescent device, it is believed that excitons are formed when electrons and holes meet and recombine in the emissive layer. It is also believed that this recombination generally occurs very close to where the electrons are injected into the emissive region. There are several possible reasons for this phenomenon. First, phosphorescent emissive materials may have superior hole transport properties, such that a phosphorescent emissive layer has a higher hole mobility than electron mobility, and holes are quickly transported across the emissive layer, as compared to electrons, which are more slowly transported. Second, holes may be injected into the emissive layer more readily than electrons. Thus, in some embodiments, organic enhancement layer 340 may act as a hole blocking layer to prevent holes from leaving the emissive layer. Some degree of hole blocking may occur where the enhancement layer material has a HOMO energy level lower than that of the material of the adjacent layer e.g. the emissive layer, from which holes are being blocked. Effective hole blocking layers generally have a HOMO energy level significantly lower than that of the adjacent layer, such as 0.25 eV lower, preferably 0.3 eV lower or more preferably 0.7 eV lower.

In one embodiment of the invention, the organic enhancement layer may include a material which includes a ligand having the following structure (II):

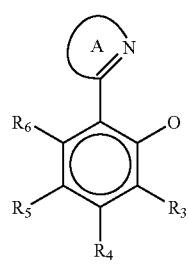

II

The substituents $R_3$, $R_4$, $R_5$ and $R_6$ are independently selected from the group consisting of H, alkyl, alkenyl, alkynyl, alkylaryl, CN, $CF_3$, $C_nF_{2n+1}$, trifluorovinyl$CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl. Optional bridging groups include —$CH_2$—$CH_2$—, —CH═CH—, —$CR_1R_2$—, —$NR_1$—, and —O—.

Ring A is an aromatic heterocyclic ring or a fused aromatic heterocyclic ring with at least one nitrogen atom that is coordinated to the metal M, wherein the ring can be optionally substituted. In a preferred embodiment, ring A has one nitrogen atom that is coordinated to the metal M, wherein ring A can be optionally substituted. In a preferred embodiment, A is pyridine, pyrimidine, quinoline, or isoquinoline. Most preferable, A is pyridine. Optional substituents on the Ring A include alkyl, alkenyl, alkynyl, alkylaryl, halo, CN, $CF_3$, $C_nF_{2n+1}$, trifluorovinyl, $CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl. Additionally, a substituent on ring A and R6 may be combined to form an ethylene ($CH_2$—$CH_2$—) or a —CH═CH— group that connects the two rings.

The term "halo" or "halogen" as used herein includes fluorine, chlorine, bromine and iodine.

The term "alkyl" as used herein contemplates both straight and branched chain alkyl substituents. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted with one or more substituents selected from halo, CN, $CO_2R_1$, $C(O)R_1$, $NR_1R_2$, cyclic-amino, $NO_2$, and $OR_1$, wherein each of $R_1$ and $R_2$ is independently selected from the group consisting of hydrogen, alkyl, alkylaryl and aryl.

The term "cycloalkyl" as used herein contemplates cyclic alkyl substituents. Preferred cycloalkyl groups are those containing 3 to 7 carbon atoms and includes cyclopropyl, cyclopentyl, cyclohexyl, and the like. Additionally, the cycloalkyl group may be optionally substituted with one or more substituents selected from halo, CN, $CO_2R_1$, $C(O)R_1$, $NR_1R_2$, cyclic-amino, $NO_2$, and $OR_1$, wherein each of $R_1$ and $R_2$ is independently selected from the group consisting of hydrogen, alkyl, alkylaryl and aryl.

The term "alkenyl" as used herein contemplates both straight and branched chain alkene substituents. Preferred alkenyl groups are those containing two to fifteen carbon atoms. Additionally, the alkenyl group may be optionally substituted with one or more substituents selected from halo, CN, $CO_2R_1$, $C(O)R_1$, $NR_1R_2$, cyclic-amino, $NO_2$, and $OR_1$, wherein each of $R_1$ and $R_2$ is independently selected from the group consisting of hydrogen, alkyl, alkylaryl and aryl.

The term "alkynyl" as used herein contemplates both straight and branched chain alkyne substituents. Preferred alkyl groups are those containing two to fifteen carbon atoms. Additionally, the alkynyl group may be optionally substituted with one or more substituents selected from halo, CN, $CO_2R_1$, $C(O)R_1$, $NR_1R_2$, cyclic-amino, $NO_2$, and $OR_1$, wherein each of $R_1$ and $R_2$ is independently selected from the group consisting of hydrogen, alkyl, alkylaryl and aryl.

The terms "alkylaryl" as used herein contemplates an alkyl group which has as a substituent an aromatic group. Additionally, the alkylaryl group may be optionally substituted on the aryl with one or more substituents selected from halo, CN, $CO_2R_1$, $C(O)R_1$, $NR_1R_2$, cyclic-amino, $NO_2$, and $OR_1$, wherein each of $R_1$ and $R_2$ is independently selected from the group consisting of hydrogen, alkyl, alkylaryl and aryl.

The term "heterocyclic group" as used herein contemplates non-aromatic cyclic substituents. Preferred heterocyclic groups are those containing 3 or 7 ring atoms which includes at least one hetero atom, and includes cyclic amines such as morpholino, piperidino, pyrrolidino, and the like, and cyclic ethers, such as tetrahydropyran, tetrahydropyran, and the like.

The term "aryl" or "aromatic group" as used herein contemplates single-ring aromatic groups and polycyclic ring systems. The polycyclic rings may have two or more rings in which two carbons are common by two adjoining rings (the rings are "fused") wherein at least one of the rings is aromatic, e.g., the other rings can be cycloalkyls, cycloalkenyls, aryl, heterocycles and/or heteroaryls.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles and/or heteroaryls.

All value ranges, for example those given for, x and y, are inclusive over the entire range. Thus, for example, a range between 0–4 would include the values 0, 1, 2, 3 and 4.

In one embodiment of the invention, the organic enhancement layer may include a material which comprises at least one ligand of Formula I and a metal ion such that the resulting material has (i) an oxygen-metal bond and (ii) the nitrogen of ring A is coordinated to the metal. Thus the organic enhancement layer materials of the present invention comprise a partial structure of formula (III):

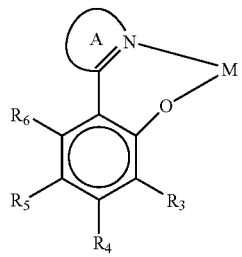

III

M may be any metal. Preferred metals include aluminum, gallium, magnesium, zinc, copper and lead. Most preferably, the metal is Al.

In another embodiment of the invention, the organic enhancement layer may include a material having the formula (I):

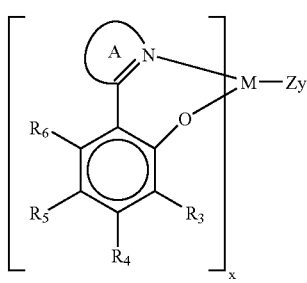

I wherein x, the number of ligands of a particular type, may be any integer from 1 to the maximum number of ligands that may be attached to the metal. For example, for Al, x may be 1, 2 or 3. y, the number of ancillary ligands of a particular type, may be any integer from zero to one less than the maximum number of ligands that may be attached to the metal. Z represents one or more ancillary ligands. For example, y may be 0 or 1 for bidentate ligands. Ancillary ligands for use in the emissive material may be selected from those known in the art. Non-limiting examples of ancillary ligands may be found in PCT Application Publication WO 02/15645 A1 to Lamansky et al. at pages 89–90, which is incorporated herein by reference.

In a preferred embodiment, the organic enhancement layer may include a material of formula I, wherein the ring A of the ligand is pyridine, so that the material has a partial structure of formula (IV):

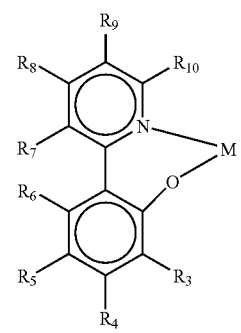

IV

The material of this embodiment has the following structure (V):

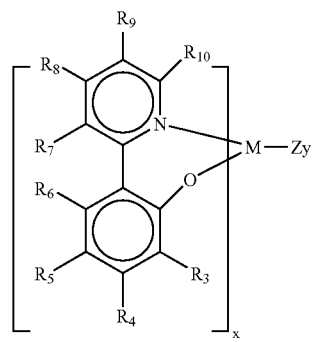

V

In the above structures, IV, and V, $R_3$–$R_{10}$ are substituents, each independently selected from the group consisting of hydrogen, alkyl, alkenyl, alkynyl, alkylaryl, CN, $CF_3$, $C_nF_{2n+1}$, trifluorovinyl, $CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl.

In another preferred embodiment, the organic enhancement layer may include a material of formula I wherein y is zero, and x is the maximum number of ligands that may be attached to the metal, the material having the formula (VI):

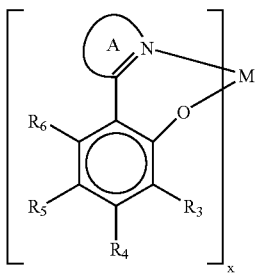

VI

For example, for Al, x is 3 in this preferred embodiment, and the structure may be referred to as a "tris" structure. The tris structure is preferred because it is believed to be particularly stable.

In one embodiment, x+y is equal to the total number of bidentate ligands that may be attached to the metal in question, for example, 3 in the case of Al. In another embodiment, x+y may be less than the maximum number of bidentate ligands that may be attached to the metal, in which case other ligands may also be added to the metal. Preferably, if there are different ligands attached to the metal, each ligand has the structure indicated in formula II.

In another embodiment of the present invention, the organic enhancement layer may include a material wherein the metal is Al and x is 3, giving a material of the formula (VII):

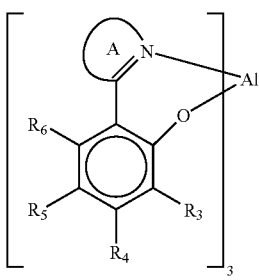

VII

In a preferred embodiment, the metal is Al and ring A is pyridine. Preferred materials are selected from the group consisting of the following formulas (VIII), (IX) and (X):

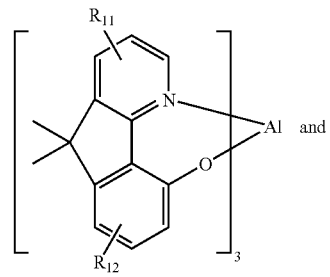

VIII

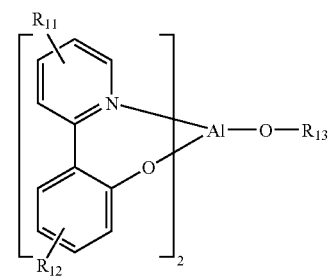

IX

X wherein $R_{11}$, $R_{12}$ and $R_{13}$ are substituents, each independently selected from the group consisting of hydrogen, alkyl, alkenyl, alkynyl, alkylaryl, CN, $CF_3$, $C_nF_{2n+1}$, trifluorovinyl, $CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl.

In a most preferred embodiment, the metal is Al, ring A is pyridine and each of substituents $R_3$–$R_{10}$ is hydrogen. The material of this embodiment has the following structure (XI):

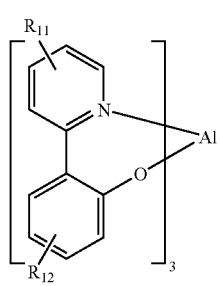

XI

Without necessarily being limited as to any particular theory as to how the invention works, it is believed that achieving hole-electron recombination in the emissive layer (EML) which contains the phosphorescent emitter is important. The recombination may be achieved by several mechanisms. One mechanism involves the use of materials that can efficiently facilitate electron injection from the enhancement layer to the EML to recombine with the holes while still in the EML. Without being bound by theory, it is believed that hole-electron recombination in the emissive layer of devices comprising the organic materials of the present invention is achieved because the LUMO level of the organic enhancement layer materials of the invention disclosed herein, such as the material of Formula XI, aluminum tris-phenoxypyridine (Al(popy)$_3$), is close to that of the materials in the EML. The organic enhancement layer may comprise a material having a lowest unoccupied molecular orbital energy level that is greater than that of the hole transporting material in the EML. Preferably, the organic enhancement layer comprises a material having a lowest unoccupied molecular orbital energy level that is not more than 0.3 eV less, preferably not more than 0.25 eV less and more preferably not more than 0.15 eV less than the energy level of the lowest unoccupied molecular orbital of the hole transporting material in the EML. Typically the EML comprises a host material such as CBP and a phosphorescent emitter such as Ir(ppy)$_3$. Additionally, it is believed that the low lying HOMO level of enhancement material relative to the HOMO level of the EML material(s) in some embodiments may lead to holes being blocked and confined within the EML, further enhancing hole-electron recombination in the emissive layer of devices comprising the organic materials of the present invention.

As demonstrated in Table 1 showing HOMO and LUMO values, below, mer-Al(popy)$_3$ has a LUMO energy of –1.37 eV, while CBP and Ir(ppy)$_3$ have LUMO energies of –1.23 and –1.21 eV respectively, Electrons which are injected from an enhancement layer comprising the material of Formula XI into an EML comprising CBP or Ir(ppy)$_3$ therefore encounter a barrier of only about 0.15 eV, which is relatively easily handled. Thus, electron injection from the material of Formula XI to the EML containing CBP and Ir(ppy)$_3$ is believed to be efficient. The LUMO energies of BCP and TBPi lead to the conclusion that electron injection to the EML comprising CBP and/or Ir(ppy)$_3$ is also thermodynamically favorable, in addition to the hole blocking mechanism enabled by their low lying HOMO energies relative to CBP and Ir(ppy)$_3$. Table 1 lists density function calculations (B3LYP 6–31G*) performed using the Spartan 02 software package with the pseudopotential option for materials containing heavy metals such as Ir(ppy)$_3$.

TABLE 1

| Compound | Density Function Theory Calculations | | |
|---|---|---|---|
|  | HOMO (eV) | LUMO (eV) | Dipole (D) |
| mer-Al(popy)$_3$ | 4.97 | 1.37 | 4.62 |
| BAlq | 5.11 | 1.76 | 2.17 |
| mer-GaQ$_3$ | 4.63 | 1.91 | 6.32 |
| fac-GaQ$_3$ | 4.93 | 1.66 | 8.85 |
| ZrQ$_4$ | 5.00 | 1.65 | 0.00 |
| BCP | 5.87 | 1.17 | 2.89 |
| TPBi | 5.70 | 1.25 | 5.63 |
| CBP | 5.32 | 1.23 | 0.00 |
| fac-Ir(ppy)$_3$ | 4.85 | 1.21 | 6.14 |

Without being bound by theory, it is believed that the organic materials of the present invention, including the material of Formula XI, demonstrate improved stability compared to, for example, BCP or TPBi because BCP and TPBi contain heteroatoms in the core ring structure. While the organic materials of the invention contain a nitrogen atom, the nitrogen atom is coordinated to the metal center. It is believed that non-coordinated heteroaryl rings are less stable towards electron transport because they are susceptible to electron attack which may lead to bond breaking. Similar improvement in stability over BCP or TPBi can be seen in devices using BAlq as the enhancement layer. BAlq contains no non-coordinated heterocycles.

The devices of the present invention show an improvement over those in the prior art utilizing, for example, BAlq. For example, BAlq is widely used as an enhancement layer material to achieve a combination of stability and efficiency. BAlq, however, begins to decompose at a temperature of 320° C., and has a glass transition temperature of 90° C. In comparison, the devices of the invention demonstrate improved thermal stability, being thermally stable up to a temperature of at least about 330° C. and having a glass transition temperature of at least about 95° C. For example, the material of formula XI is thermally stable up to a temperature of 350° C., and has a glass transition temperature of 108° C. The improved thermal stability of the devices of the invention can lead to corresponding improved OLED operational and storage stability at elevated temperatures. In addition, the devices of the invention are higher energy gap materials than BAlq, having fluorescence peaks at about 450 nm or less, compared to 480 nm for BAlq. For example, the material of formula XI has a fluorescence peak at about 430 nm. Without being bound by theory, it is believed that the higher energy gap can increase exciton blocking functions in OLEDs. This is of particular importance in blue OLEDs because of the high energy associated with blue phosphorescence.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting. While many embodiments of the invention allow for superior device performance in the absence of hole blocking, it is understood that some embodiments of the invention may be combined with hole blocking.

In one embodiment of the present invention, the organic materials can contain structural isomers. For example, the material of Formula XI can exist in the facial and/or the meridional isomers. It is believed that these structural isomers have similar properties.

Material Definitions:

As used herein, abbreviations refer to materials as follows:

Al(popy)$_3$ aluminum tris-phenoxypyridine
CBP: 4,4'-N,N-dicarbazole-biphenyl
m-MTDATA 4,4',4"-tris(3-methylphenylphenlyamino)triphenylamine
Alq$_3$: aluminum(III) tris(8-hydroxyquinolate)
Bphen: 4,7-diphenyl-1,10-phenanthroline
n-BPhen: n-doped BPhen (doped with lithium)
F$_4$-TCNQ: tetrafluoro-tetracyano-quinodimethane
p-MTDATA: p-doped m-MTDATA (doped with F$_4$-TCNQ)
Ir(ppy)$_3$: tris(2-phenylpyridine)-iridium
Ir(ppz)$_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N—N'-di(1-naphthyl)-benzidine
TPD: N,N'-diphenyl-N,N'-di(3-toly)-benzidine
BAlq: aluminum(III)bis(2-methyl-8-quinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone PEDOT:PSS: an aqueous dispersion of poly(3,4-ethylene-dioxythiophene) with polystyrenesulfonate (PSS)
ZrQ$_4$: zirconium(IV) tetrakis(8-hydroxyquinolate)
HfQ$_4$: hafnium(IV) tetrakis(8-hydroxyquinolate)
GaQ$_3$: gallium(III) tris(8-hydroxyquinolate)
PBD: 2-(4-biphenylyl)-5-phenyl-1,3,4-oxidiazole
TPBi: 2,2',2"-(1,3,5-benzenetriyl)tris-(1-phenyl-1H-benzimidazole)
Boron 1: 1,4-Bis(diphenylboronyl)benzene
Boron 2: Tris(2,3,5,6-tetramethylphenyl)borane Experimental:

Specific representative embodiments of the invention will now be described, including how such embodiments may be made. It is understood that the specific methods, materials, conditions, process parameters, apparatus and the like do not necessarily limit the scope of the invention.

EXAMPLE 1

Synthesis of Aluminum tris-phenoxypyridine (Compound XI)

Step 1

9.5 g (~43 mmol) of 2-(4,4,5,5-tetramethyl-1,3,2-dioxaborolan-2-yl)phenol, 6.8 g (~43 mmol) of 2-bromopyridine, 1.5 g (1.3 mmol) of Pd(PPh$_3$)$_4$, and 16 g (116 mmol) of K$_2$CO$_3$ were added to a 250 mL round bottle flask, along with a solvent mixture of 120 mL of dimethoxyethane and 150 mL of water. The mixture was heated to reflux for 24 hours under nitrogen. The reaction mixture was extracted with ethyl acetate and the organic phase was separated on silica gel column with 15% ethyl acetate as elute solvent. ~5.9 g (yield ~80%) of 2-(2-hydroxyphenyl)pyridine was obtained as a colorless liquid.

Step 2

To a flame-dried 250 mL round bottle flask was added, under nitrogen, 5.3 g (30 mmol) of 2-(2-hydroxypheny)pyridine. 20 mL of anhydrous THF was transferred into the flask and the solution was bubbled with nitrogen for 45 min. 4.47 mL of 2.0 M AlMe$_3$ in toluene was added slowly. The reaction mixture was stirred at ~35° C. for 5 days. The reaction mixture was filtered and washed three times with dry THF. 4 g of Al(popy)$_3$ (yield 83%) was obtained.

EXAMPLE 2 AND COMPARATIVE EXAMPLES 1–3

Experimental Device Fabrication

All devices were fabricated by high vacuum (<10$^{-7}$ Torr) thermal evaporation. The anode electrode was approximately 120 nm of indium tin oxide (ITO). The organic stack was comprised of 10 nm thick of copper phthalocyanine (CuPc) as the hole injection layer (HIL), 30 nm of 4,4'-bis[N-(1-naphthyl)-N-phenylamino]biphenyl (a-NPD), as the hole transporting layer (HTL), 30 nm of 4,4'-bis(N-carbazolyl)biphenyl (CBP) doped with 6 wt % of fac-tris(2-phenylpyridine)iridium [Ir(ppy)$_3$] as the emissive layer (EML).

The enhancement layers were each 10 nm thick. The materials used are listed in Table 1. The electron transporting layer consisted of 40 nm of tris(8-hydroxyquinolinato) aluminum (Alq$_3$).

The cathode consisted of 1 nm of LiF followed by 100 nm of Al. All devices were encapsulated with a glass lid sealed with an epoxy resin in a nitrogen glove box (<1 ppm of H$_2$O and O$_2$) immediately after fabrication, and a moisture getter was incorporated inside the package.

The current-voltage-luminance (IVL) characteristics and operational lifetime are summarized in Table 2, below. A typical display brightness level of 600 cd/m$^2$ for green emitting devices was chosen for the comparison between different devices.

TABLE 2

| Example | Enhancement layer material | Efficiency (cd/A) at 600 cd/m$^2$ | % luminance retained at 100 hours at initial luminance of 600 cd/m$^2$ |
|---|---|---|---|
| 2 | Al(popy)$_3$ | 20 | 95 |
| Comparative 1 | BAlq | 22 | 95 |
| Comparative 2 | TPBi | 22 | 75 |
| Comparative 3 | BCP | 35 | 85 |

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device comprising,
an anode;
a cathode;
a first organic layer disposed between the anode and the cathode, wherein the first organic layer produces phosphorescent emission when a voltage is applied between the anode and the cathode; and
an organic enhancement layer disposed between the first organic layer and the cathode, wherein the organic enhancement layer is in physical contact with the first organic layer, and wherein the organic enhancement layer comprises a material having the structure:

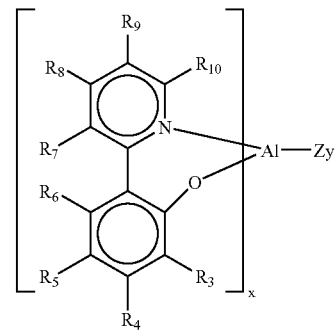

wherein R$_3$–R$_{10}$ are substituents, each independently selected from the group consisting of hydrogen, alkyl, alkenyl, alkynyl, alkylaryl, CN, perfluoroalkyl, trifluorovinyl, CO$_2$R$_1$, C(O)R$_1$, NR$_1$R$_2$, NO$_2$, OR$_1$, halo, aryl, heteroaryl, substituted aryl, substituted heteroaryl or a heterocyclic group, wherein each of R$_1$ and R$_2$ is independently selected from the group consisting of hydrogen, alkyl, alkylaryl and aryl;

additionally or alternatively, any one or more of $R_7$ and $R_8$, $R_8$ and $R_9$, or $R_9$ and $R_{10}$, together form independently a fused aromatic ring;

each Z may be the same or different, and is an ancillary ligand;

x is a value from 1 to the maximum number of ligands that may be attached to the metal; and x+y is less than or equal to the maximum number of ligands that may be attached to the metal.

2. The device of claim 1, wherein y is zero.

3. The device of claim 1, wherein $R_3$–$R_{10}$ are each hydrogen.

4. The device of claim 1, wherein the organic enhancement layer comprises a material of Formula X having the structure:

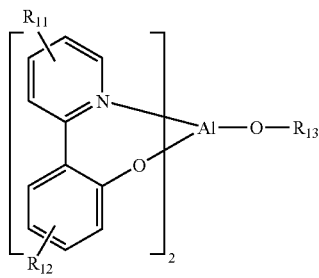

X wherein $R_{11}$, $R_{12}$ and $R_{13}$ are substituents, each independently selected from the group consisting of hydrogen, alkyl, alkenyl, alkynyl, alkylaryl, CN, perfluoroalkyl, trifluorovinyl, $CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl.

5. The device of claim 1, wherein the organic enhancement layer comprises a material of Formula XI having the structure:

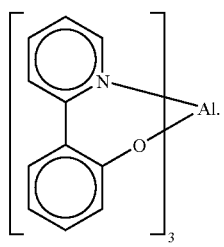

XI

6. The device of claim 5, wherein the material of Formula XI has a glass transition temperature of at least about 108° C.

7. The device of claim 5, wherein the material of Formula XI present in the device has a fluorescence peak at less than about 430 nm.

8. The device of claim 1, wherein the material has a glass transition temperature of at least about 95° C.

9. The device of claim 1, wherein the material has a fluorescence peak at less than about 450 nm.

10. The device of claim 1, wherein the organic enhancement layer is in physical contact with the cathode.

11. The device of claim 1, further comprising an additional organic layer disposed between the organic enhancement layer and the cathode.

12. The device of claim 1, wherein the first organic layer comprises a hole transporting material.

13. The device of claim 12, wherein the organic enhancement material comprises a material having a lowest unoccupied molecular orbital energy level that is not more than 0.3 eV less than the energy level of the lowest unoccupied molecular orbital of the hole transporting material in the first organic layer.

14. The device of claim 13, wherein the organic enhancement material comprises a material having a lowest unoccupied molecular orbital energy level that is not more than 0.15 eV less than the energy level of the lowest unoccupied molecular orbital of the hole transporting material in the first organic layer.

15. The device of claim 12, wherein the organic enhancement material comprises a material having a lowest unoccupied molecular orbital energy level that is greater than the energy level of the lowest unoccupied molecular orbital of the hole transporting material in the first organic layer.

16. A device comprising
an anode;
a cathode;
a first organic layer disposed between the anode and the cathode, wherein the first organic layer produces phosphorescent emission when a voltage is applied between the anode and the cathode; and
an organic enhancement layer disposed between the first organic layer and the cathode, wherein the organic enhancement layer is in physical contact with the first organic layer, and wherein the organic enhancement layer comprises a material of Formula IX having the structure:

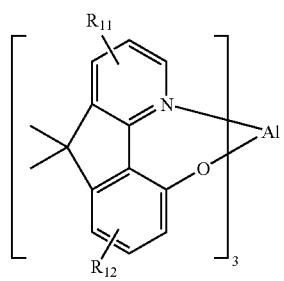

IX wherein $R_{11}$ and $R_{12}$ are substituents, each independently selected from the group consisting of hydrogen, alkyl, alkenyl, alkynyl, alkylaryl, CN, perfluoroalkyl, trifluorovinyl, $CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl.

17. A device, comprising:

an anode;

a cathode;

a first organic layer disposed between the anode and the cathode, wherein the first organic layer produces phosphorescent emission when a voltage is applied between the anode and the cathode; and an organic enhancement layer disposed between the first organic layer and the cathode, wherein the organic enhancement layer is in physical contact with the first organic layer, and wherein the organic enhancement layer comprises a material which comprises a ligand having the structure:

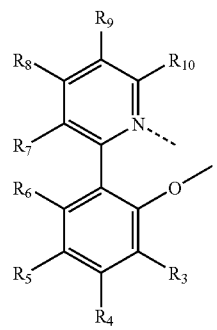

wherein the ligand is attached to a metal M, such that the resulting material has (i) an oxygen-metal bond and (ii) the nitrogen is coordinated to the metal;

wherein $R_3$–$R_{10}$ are substituents, each independently selected from the group consisting of hydrogen, alkyl, alkenyl, alkynyl, alkylaryl, CN, perfluoroalkyl, trifluorovinyl, $CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl; and, additionally or alternatively, any one or more of $R_7$ and $R_8$, $R_8$ and $R_9$, or $R_9$ and $R_{10}$, together form independently a fused aromatic ring; and wherein M is aluminum.

18. The device of claim 17, wherein $R_3$, $R_4$, $R_5$ and $R_6$ are each hydrogen.

19. The device of claim 17, wherein the first organic layer comprises a hole transporting material.

20. The device of claim 19, wherein the organic enhancement material comprises a material having a lowest unoccupied molecular orbital energy level that is not more than 0.3 eV less than the energy level of the lowest unoccupied molecular orbital of the hole transporting material in the first organic layer.

21. The device of claim 20, wherein the organic enhancement material comprises a material having a lowest unoccupied molecular orbital energy level that is not more than 0.15 eV less than the energy level of the lowest unoccupied molecular orbital of the hole transporting material in the first organic layer.

22. The device of claim 19, wherein the organic enhancement material comprises a material having a lowest unoccupied molecular orbital energy level that is greater than the energy level of the lowest unoccupied molecular orbital of the hole transporting material in the first organic layer.

23. A device comprising:

an anode;

a cathode;

a first organic layer disposed between the anode and the cathode, wherein the first organic layer produces phosphorescent emission when a voltage is applied between the anode and the cathode; and an organic enhancement layer disposed between the first organic layer and the cathode, wherein the organic enhancement layer is in physical contact with the first organic layer, and wherein the organic enhancement layer comprises a material of Formula V having the structure:

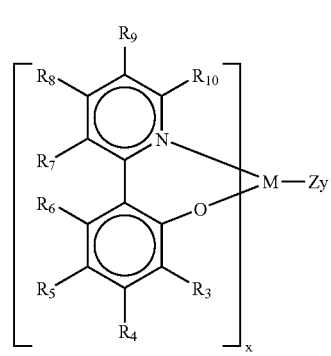

V wherein

M is a metal selected from the group consisting of aluminum, gallium, zinc, copper, and lead;

$R_3$–$R_{10}$ are substituents, each independently selected from the group consisting of hydrogen, alkyl, alkenyl, alkynyl, alkylaryl, CN, perfluoroalkyl, trifluorovinyl, $CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl;

additionally or alternatively, any one or more of $R_7$ and $R_8$, $R_8$ and $R_9$, or $R_9$ and $R_{10}$, together form independently a fused aromatic ring;

each Z may be the same or different, and is an ancillary ligand;

x is a value from 1 to the maximum number of ligands that may be attached to the metal; and x+y is less than or equal to the maximum number of ligands that may be attached to the metal.

24. The device of claim 23, wherein y is zero and x is the maximum number of ligands that may be attached to the metal M.

25. The device of claim 23, wherein $R_3$–$R_{10}$ are each hydrogen.

26. The device of claim 23, wherein y is zero.

27. The device of claim 23, wherein the material has a glass transition temperature of at least about 95° C.

28. The device of claim 23, wherein the material has a fluorescence peak at less than about 450 nm.

29. The device of claim 23, wherein the organic enhancement layer is in physical contact with the cathode.

30. The device of claim 23, further comprising an additional organic layer disposed between the organic enhancement layer and the cathode.

31. The device of claim 23, wherein the first organic layer comprises a hole transporting material.

32. The device of claim 31, wherein the organic enhancement material comprises a material having a lowest unoccupied molecular orbital energy level that is not more than 0.3 eV less than the energy level of the lowest unoccupied molecular orbital of the hole transporting material in the first organic layer.

33. The device of claim 32, wherein the organic enhancement material comprises a material having a lowest unoccupied molecular orbital energy level that is not more than 0.15 eV less than the energy level of the lowest unoccupied molecular orbital of the hole transporting material in the first organic layer.

34. The device of claim 31, wherein the organic enhancement material comprises a material having a lowest unoccupied molecular orbital energy level that is greater than the energy level of the lowest unoccupied molecular orbital of the hole transporting material in the first organic layer.

35. A device, comprising:
an anode;
a cathode;
a first organic layer disposed between the anode and the cathode, wherein the first organic layer produces phosphorescent emission when a voltage is applied between the anode and the cathode; and
an organic enhancement layer disposed between the first organic layer and the cathode, wherein the organic enhancement layer is in physical contact with the first organic layer, and wherein the organic enhancement layer comprises a material which comprises a ligand having the structure:

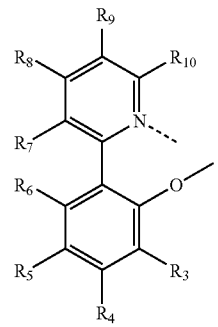

wherein the ligand is attached to a metal M, such that the resulting material has (i) an oxygen-metal bond and (ii) the nitrogen is coordinated to the metal;

wherein $R_3$–$R_{10}$ are substituents, each independently selected from the group consisting of hydrogen, alkyl, alkenyl, alkynyl, alkylaryl, CN, perfluoroalkyl, trifluorovinyl, $CO_2R_1$, $C(O)R_1$, $NR_1R_2$, $NO_2$, $OR_1$, halo, aryl, heteroaryl, substituted aryl, substituted heteroaryl or a heterocyclic group, wherein each of $R_1$ and $R_2$ is independently selected from the group consisting of hydrogen, alkyl, alkylaryl and aryl; and, additionally or alternatively, any one or more of $R_7$ and $R_8$, $R_8$ and $R_9$, or $R_9$ and $R_{10}$, together form independently a fused aromatic ring wherein M is selected from the group consisting of aluminum, gallium, zinc, copper and lead.

* * * * *